(12) United States Patent  (10) Patent No.: US 7,393,237 B2
Kuo  (45) Date of Patent: Jul. 1, 2008

(54) CABLE ASSEMBLY WITH LIGHT EMITTING DIODE

(75) Inventor: Peter Kuo, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/784,903

(22) Filed: Apr. 10, 2007

(65) Prior Publication Data

US 2007/0238364 A1 Oct. 11, 2007

(30) Foreign Application Priority Data

Apr. 10, 2006 (CN) .................... 2006 2 0072331

(51) Int. Cl.
*H01R 3/00* (2006.01)

(52) U.S. Cl. .................... 439/490; 439/56; 362/249

(58) Field of Classification Search ................ 439/490, 439/488, 56, 502; 362/249, 236
See application file for complete search history.

(56) References Cited

U.S. PATENT DOCUMENTS 6,227,911 B1   5/2001  Boutros et al.
6,319,051 B1 * 11/2001 Chang et al. ................. 439/490
6,699,065 B1   3/2004  Espenshade et al.
6,926,558 B2 *  8/2005 Sasai et al. ............. 439/620.04
6,979,223 B2 * 12/2005 Chen .......................... 439/490
2003/0194906 A1* 10/2003 Arkin et al. ................. 439/490

* cited by examiner

*Primary Examiner*—Hien Vu
(74) *Attorney, Agent, or Firm*—Wei Te Chung

(57) ABSTRACT

A cable assembly (100) includes a connector (3) receiving a plurality of terminals, a printed circuit board (PCB) (4), a Light Emitting Diode (LED) member (5) and a cable (7). The PCB comprises a pair of opposite mounting surfaces. One of the mounting surfaces is attached to a rear end of the connector, and electrically connecting with the terminals. The LED member comprises a plurality of tail portions (51) soldering to the other mounting surface, each tail portion comprises a straight portion (511), a connecting portion extending forwardly from the distal end of the straight portion, and a soldering portion (512) extending vertically from the distal end of the connecting portion. The cable electrically connects with the PCB.

12 Claims, 5 Drawing Sheets

CABLE ASSEMBLY WITH LIGHT EMITTING DIODE

BACKGROUND OF THE INVENTION

1. Field of the Invention

The present invention relates to a cable assembly, and particularly to a cable assembly with a Light Emitting Diode (LED).

2. Description of Prior Arts

Nowadays, the portable consumer electronic device, such as MP3 player, Digital camera etc, used an external cable assembly to charge up. Accordingly, a Light Emitting Diode is always assembled on that cable assembly to show the charging statement. How to assemble the LED to the cable assembly? The prior art show us two ways. First way, the tail portions of the LED are configured to L-shape, and inserted into a Printed Circuit Board (PCB). However, the L-shape tail portions occupy a bigger space in front-to-back direction, and the size of the cable assembly is accordingly increased. Another way, the tail portions of the LED are straight, and soldered to the cable assembly in a SMT (Surface Mount Technology) mean. But this type of tail portion occupies a bigger space in up-to-down direction, and the size of the cable assembly is accordingly increased.

Obviously, it is desirable to have an improved structure to decrease the size of the cable assembly.

SUMMARY OF THE INVENTION

An object of the present invention is to provide a cable assembly with LED has a less size.

To achieve the above object, a cable assembly includes a connector receiving a plurality of terminals, a printed circuit board (PCB), a Light Emitting Diode (LED) member and a cable. The PCB comprises a pair of opposite mounting surfaces. One of the mounting surfaces is attached to a rear end of the connector, and electrically connecting with the terminals. The LED member comprises a plurality of tail portions soldering to the other mounting surface, each tail portion comprises a straight portion, a connecting portion extending forwardly from the distal end of the straight portion, and a soldering portion extending vertically from the distal end of the connecting portion. The cable electrically connects with the PCB.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
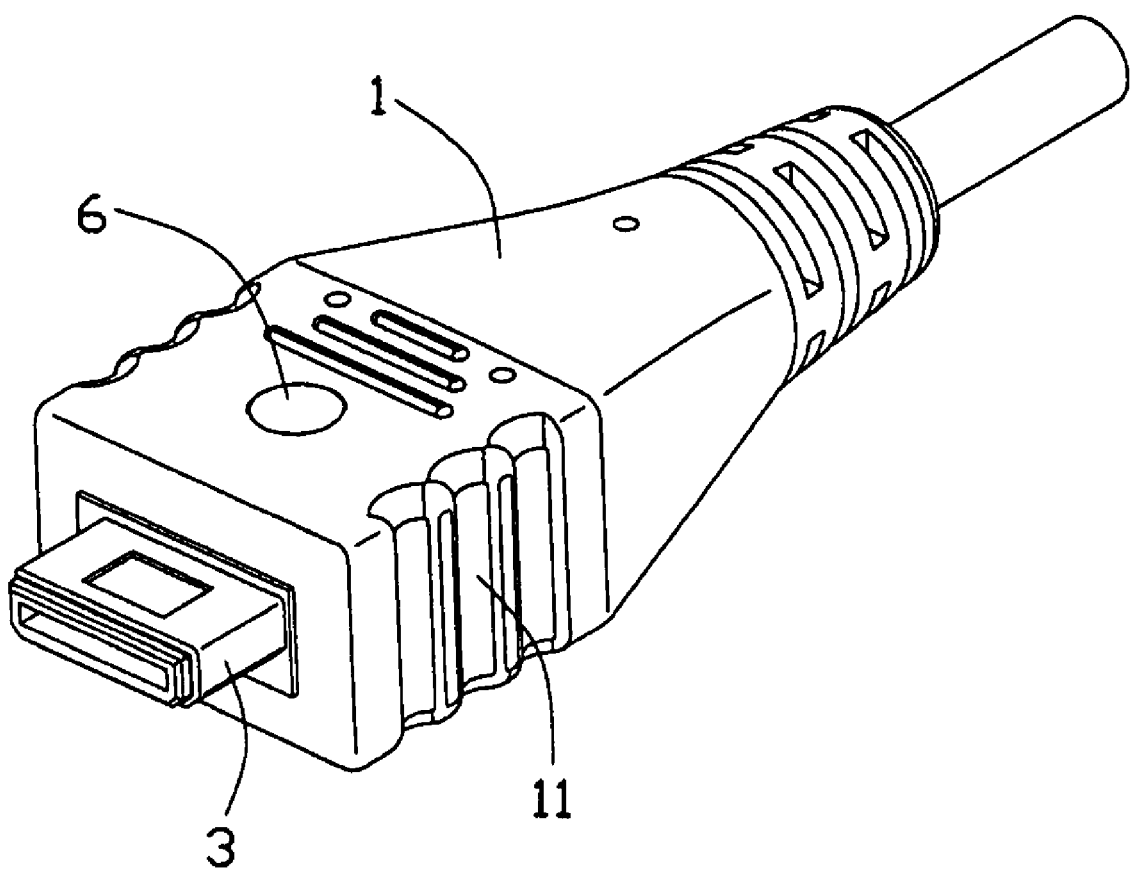
FIG. 1 is an assembled, perspective view of a cable assembly in accordance with the present invention.
Figure 2:
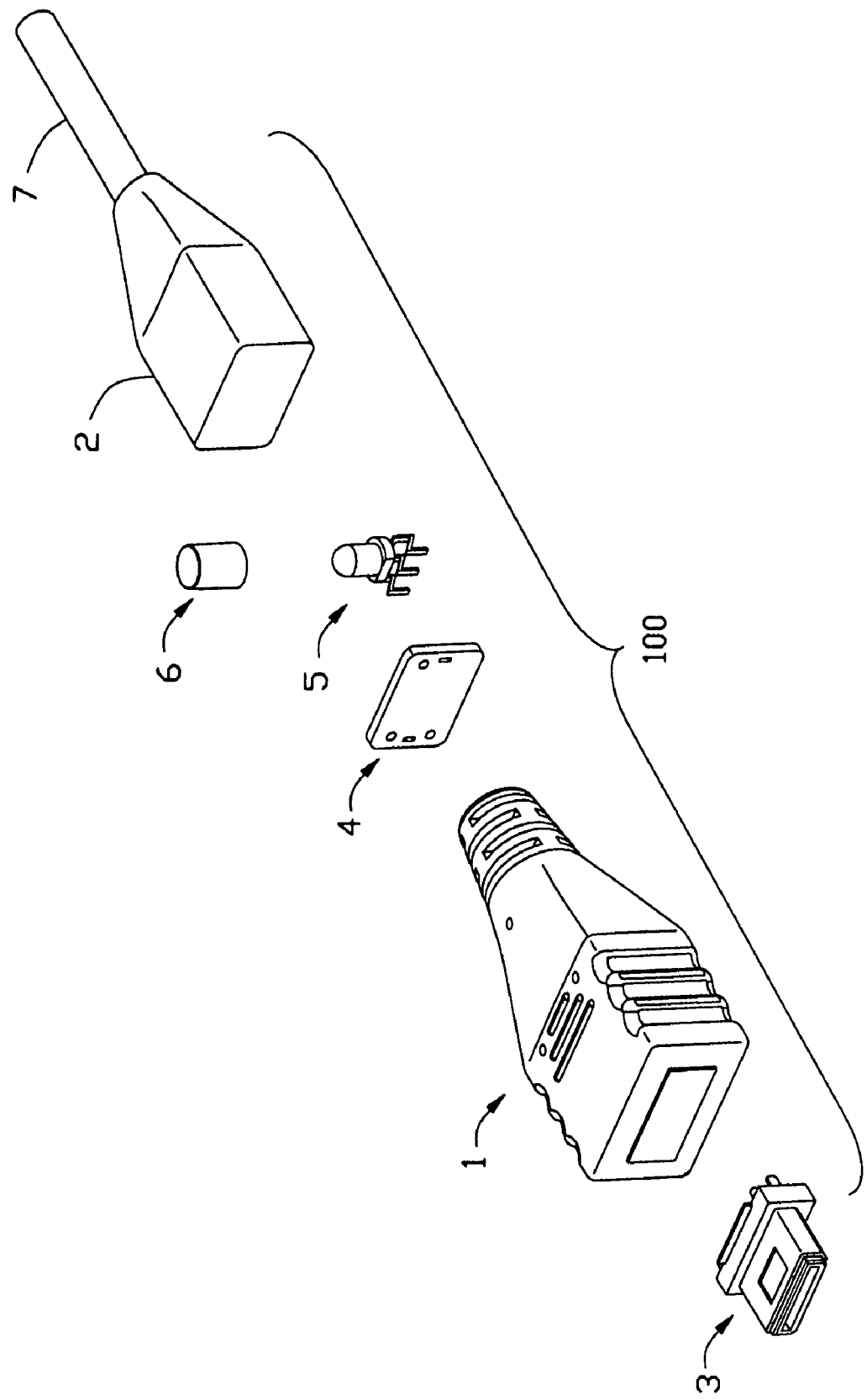
FIG. 2 is an exploded, perspective view of the cable assembly shown in FIG. 1.

Referring to FIGS. 1 to 4, a cable assembly 100 in accordance with the present invention comprises insulative mold 1, a connector 3, a Printed Circuit Board 4 (PCB) assembled on a rear end of the connector 3, a LED 5 soldered on the PCB 4, a bucket 6 capped on the LED 4 and a cable 7 electrically connecting with the connector 3.

Figure 3:
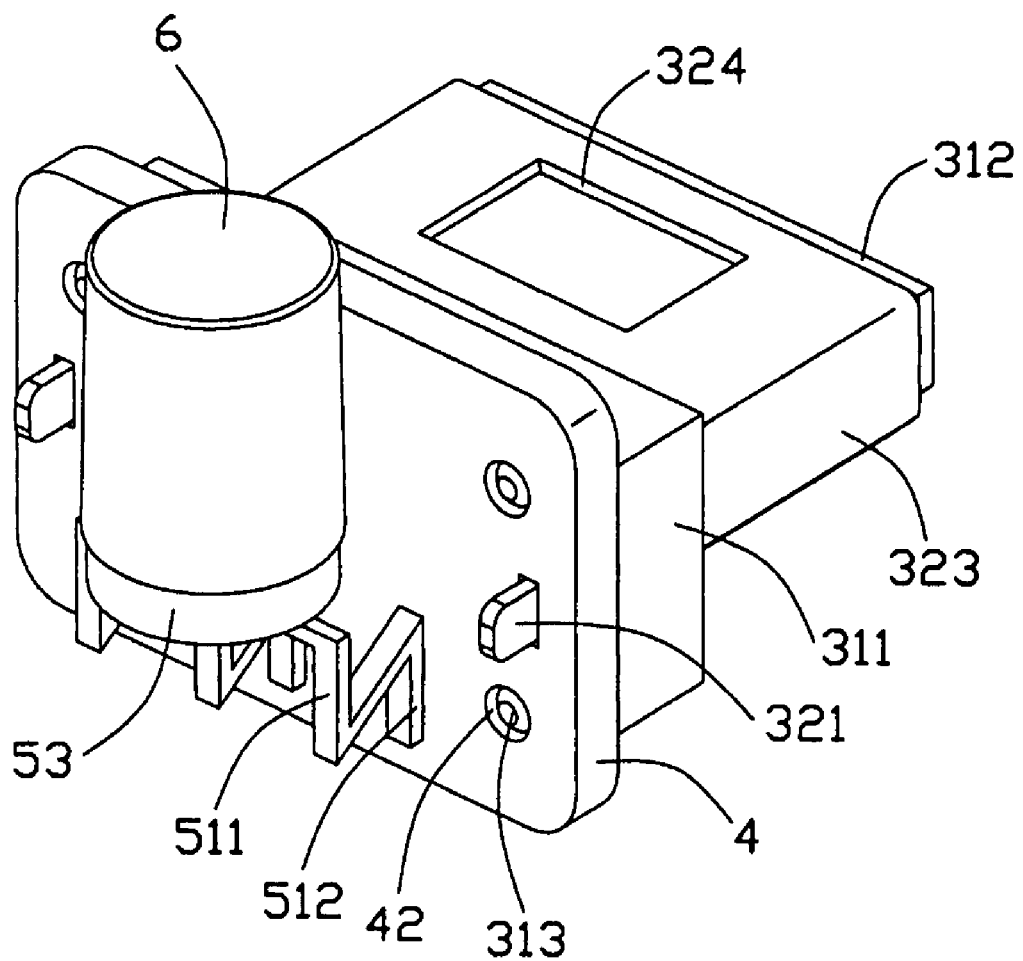
FIG. 3 is an assembled, perspective view of the LED assembled on the connector shown in FIG. 2.
Figure 4:
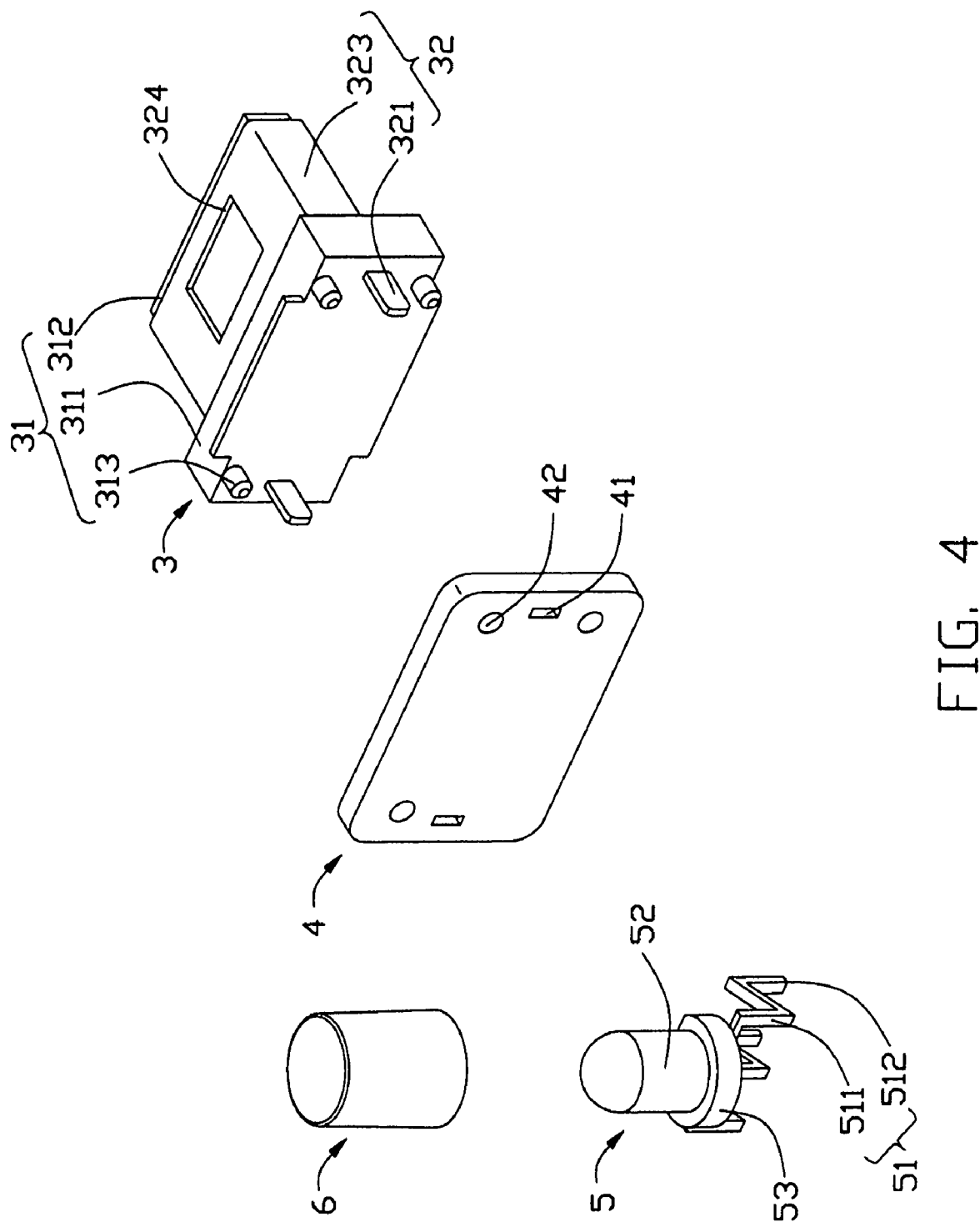
FIG. 4 is an exploded, perspective view of FIG. 3.
Figure 5:
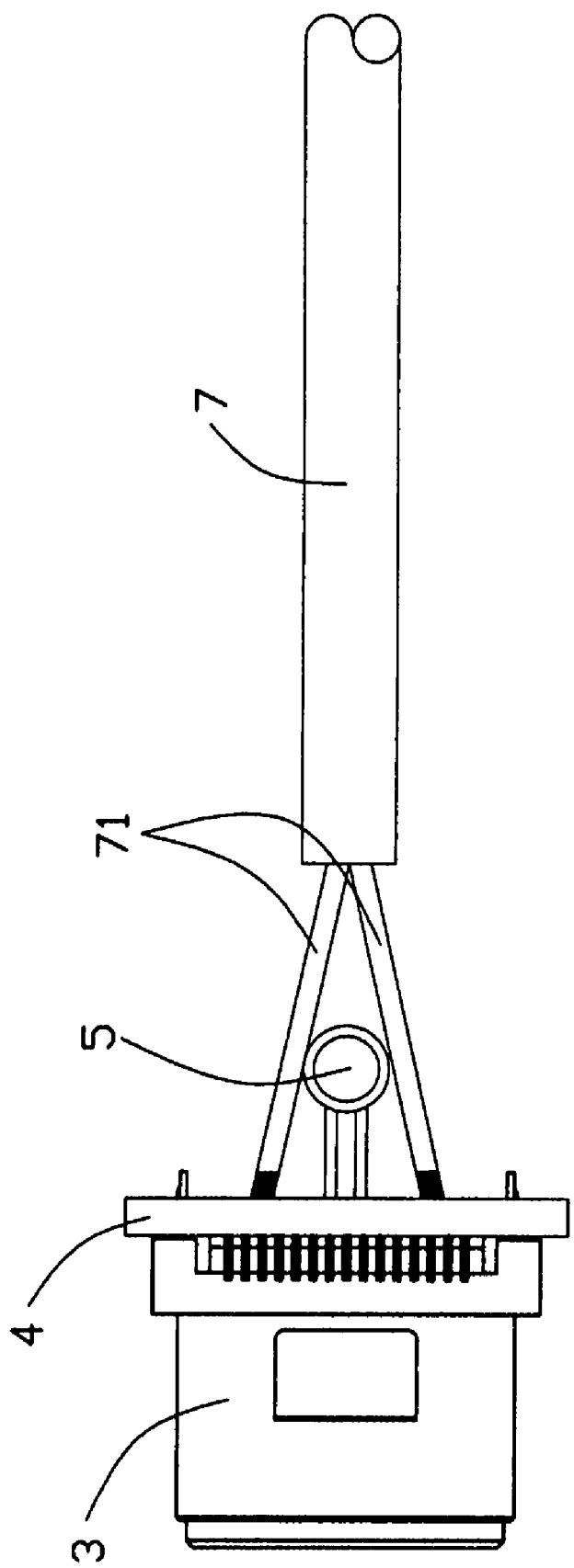
FIG. 5 is a top view of the cable assembly shown in FIG. 1.

Referring to FIGS. 3 and 4, the connector 3 comprises a mating port 32 and an insulative housing 31 joining with the mating port 32. The mating port 32 comprises a mating frame 323 and a soldering plates 321 rearwardly extending from the opposite ends of the mating frame 323. The mating frame 323 defines a locking hole 324 thereon for locking with the complementary connector (not shown). The insulative housing comprises a base portion 311, a receiving portion 312 extending forwardly from the base portion 311, and a plurality of positioning post 313 extending rearwardly from a rear surface thereof. The receiving portion 312 retains a plurality of terminals (not shown).

The PCB 4 has two mounting surfaces (not labeled). One of the mounting surfaces is attached to the rear surface of the connector 3, and electrically connecting with the terminals. A plurality of positioning holes 42 and a pair of passageways 41 are defined on and communicating the two mounting surfaces of the PCB 4. The positioning posts 313 of the connector 3 are retained in corresponding positioning holes 42, and the soldering plates 321 of connector 3 are inserted through corresponding passageways 41.

The LED 5 comprises a circular base 53, a plurality of tail portions 51 extending downwardly from the base 53, and a lighting portion 52 assembled on the base 53 and electrically connecting with the tail portions 51. Each tail portion 51 comprises a straight portion 511, a connecting portion (not labeled) extending slantly and forwardly from the distal end of the straight portion 511 and a soldering portion 512 extending downwardly from the distal end of the connecting portion. The whole tail portion 51 is configured to Z-shape from a lateral direction. The soldering portions 512 are soldered to the PCB 4 by SMT and electrically connect with the terminals of the connector 3. The bucket 6 is capped on the lighting portion 52.

The cable 7 comprises a plurality of wires 71 and an insulative layer enclosing the wires. The wires 71 are soldering to PCB 4, and electrically connect with the terminals in the connector 3.

The insulative mold 1 is over-molded on the insulative housing 31 of the mating port 3, the PCB 4, the LED 5, bucket 6 and partial cable 7.

Obviously, in a front-to-back direction, the Z-shape tail portion 51 is save the space than the L-shape tail portion. In an up-to-down direction, the Z-shape tail portion 51 is save the space than the straight tail portion. Accordingly, the size of the cable assembly 100 is decreased.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A cable assembly comprising:
    a connector having a frame for receiving a plurality of terminals and a base portion;
    a printed circuit board (PCB) with a pair of opposite mounting surfaces, one of the mounting surfaces being attached to a rear end of the connector, and electrically connecting with the terminals, said PCB being positioned parallel to said base portion;

a Light Emitting Diode (LED) member with a plurality of tail portions soldering to the other mounting surface, each tail portion comprising a straight portion, a connecting portion extending forwardly from the distal end of the straight portion, and a soldering portion extending vertically from the distal end of the connecting portion;

a cable electrically connecting with the PCB;

wherein the connector comprises a pair of rearward extending soldering plates, the PCB comprises a pair of passageways, said soldering plates pass through corresponding passageways; and wherein the tail portion is configured being N-shape in a lateral view.

2. The cable assembly as described in claim 1, wherein the soldering portion downwardly extends from the distal end of the connecting portion.

3. The cable assembly as described in claim 1, wherein the connecting portion slantly extends from the distal end of the straight portion.

4. The cable assembly as described in claim 1, wherein the PCB is perpendicular to a mating direction of the connector inserted into a complementary connector.

5. The cable assembly as described in claim 1, wherein the soldering portion of the tail portion of the LED member is soldered to PCB by Surface Mount Technology.

6. The cable assembly as described in claim 1, wherein the LED member is parallel with the PCB.

7. A cable assembly comprises:
a connector having a frame for receiving a plurality of terminals and a base portion;
a printed circuit board with a pair of opposite mounting surfaces, one of the mounting surfaces being attached to a rear end of the connector, and electrically connecting with the terminals, said PCB being positioned parallel to said base portion;
a LED member with a plurality of tail portions soldering to the other mounting surface, each tail portion comprising three portions, a second portion is bent from a first portion, and a third portion bent vertically from the second portion, the third portion is soldered to the PCB;
a cable electrically connecting with the PCB;
wherein the tail portion is configured being N-shape in a lateral view;
wherein the cable assembly further comprises a bucket capped on the LED member.

8. The cable assembly as described in 7, wherein the LED member is parallel with the PCB.

9. The cable assembly as described in claim 7, wherein the third portion of the tail portion of the LED member is soldered to PCB by Surface Mount Technology.

10. The cable assembly as described in claim 7, wherein the PCB is perpendicular to a mating direction of the connector inserted into a complementary connector.

11. The cable assembly as described in claim 7, further comprising an insulative mold enclosing the partial connector, the PCB, the LED member and the partial cable.

12. A cable connector assembly comprising:
a connector including an insulative housing with a having a base portion and a plurality of contacts in said housing;
a printed circuit board (PCB) being attached vertically behind the housing with tails of the contacts connected on a front surface of the PCB, said PCB being positioned parallel to said base portion;
an LED (Light Emitting Diode) vertically attached to a back surface of PCB; and
at least two wires electrically connected to the back surface of the PCB without interference with the LED;
wherein leads of the LED is not straight;
wherein the cable assembly further comprises a bucket capped on the LED member;
wherein each of said leads defines two vertical sections and a transverse section; wherein each of said leads is configured with a Z-shape.

* * * * *